United States Patent
Zhu et al.

(10) Patent No.: US 7,511,319 B2
(45) Date of Patent: Mar. 31, 2009

(54) METHODS AND APPARATUS FOR A STEPPED-DRIFT MOSFET

(75) Inventors: Ronghua Zhu, Chandler, AZ (US); Amitava Bose, Tempe, AZ (US); Vishnu K. Khemka, Phoenix, AZ (US); Todd C. Roggenbauer, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 356 days.

(21) Appl. No.: 11/361,624

(22) Filed: Feb. 24, 2006

(65) Prior Publication Data
US 2007/0200184 A1 Aug. 30, 2007

(51) Int. Cl.
*H01L 21/76* (2006.01)

(52) U.S. Cl. .............. 257/213; 257/327; 257/492; 257/493; 257/496; 257/E29.256; 257/E29.258; 257/E29.261

(58) Field of Classification Search ............. 257/327, 257/492, 493, 496, E29.256, E29.258, E29.261
See application file for complete search history.

(56) References Cited
U.S. PATENT DOCUMENTS 5,907,462 A * 5/1999 Chatterjee et al. ............ 361/56

6,548,874 B1 * 4/2003 Efland et al. ................ 257/371

OTHER PUBLICATIONS

Mitros, Josef et al., "High voltage drain extended MOS transistors for 0/18-um logic CMOS process," IEEE Transactions on Electron Devices, vol. 48, No. 8, Aug. 2001.
Kwon, Oh-Kyong et al., "Optimized 60-V lateral DMOS devices for VLSI power applications," Semiconductor Process and Design Center, Texas Instruments, Inc. Dallas, Texas 75243.
PCT/US07/61843 International Search Report and Written Opinion.

* cited by examiner

*Primary Examiner*—Ngan Ngo
*Assistant Examiner*—Benjamin Tzu-Hung Liu
(74) *Attorney, Agent, or Firm*—Ingrassia, Fisher & Lorenz, P.C.

(57) ABSTRACT

A power metal-oxide-semiconductor field effect transistor (MOSFET)(100) incorporates a stepped drift region including a shallow trench insulator (STI)(112) partially overlapped by the gate (114) and which extends a portion of the distance to a drain region (122). A silicide block extends from and partially overlaps STI (112) and drain region (122). The STI (112) has a width that is approximately 50% to 75% of the drift region.

16 Claims, 2 Drawing Sheets

METHODS AND APPARATUS FOR A STEPPED-DRIFT MOSFET

FIELD OF THE INVENTION

The present invention generally relates to semiconductor devices and, more particularly, to metal-oxide semiconductor field effect transistors (MOSFETs) having drift regions.

BACKGROUND OF THE INVENTION

Two of the primary characteristics of a power metal-oxide semiconductor field effect transistor (MOSFET) are its breakdown voltage and on-resistance. It is typically desirable to design a MOSFET with a relatively high breakdown voltage such that it can withstand high voltage transients and operate within a greater safe operating area (SOA). At the same time, it is also desirable to design the MOSFET such that it has a low on-resistance, because on-resistance per unit area directly impacts die size and cost. Unfortunately, there is a fundamental trade-off between breakdown voltage and on-resistance.

Low voltage MOSFETS (e.g., those with voltages of less than approximately 15 V) commonly incorporate an active drift region since the gate oxide of such devices does not experience high stress. The on-resistance of these low-voltage active drift structures is fairly low. High voltage MOSFETs (e.g., those with voltages of greater than about 15 V), on the other hand, often incorporate a field drift region (e.g., a shallow trench isolation, or "STI") in order to reduce gate stress. The on-resistance of such structures is increased as there surface conduction (a low resistance path) is effectively removed.

Accordingly, there is a need for MOSFET structure that is capable of better optimizing the trade-off between breakdown voltage and on-resistance per unit area. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. Conventional terms and processes relating to semiconductor processing are known to those skilled in the art, and are therefore not discussed in detail herein.

In general, a power metal-oxide-semiconductor field effect transistor (MOSFET) in accordance with the present invention incorporates a stepped drift region including a shallow trench insulator partially overlapped by the gate and which extends a portion of the distance to a drain region (e.g., about 50% to 75% of the distance from the STI to the drain region), while a silicide block extends from and partially overlaps the STI and drain regions. In this way, both active drift and field drift structures are implemented to improve the trade-off between breakdown voltage vs. on-resistance trade-off.

Figure 1:
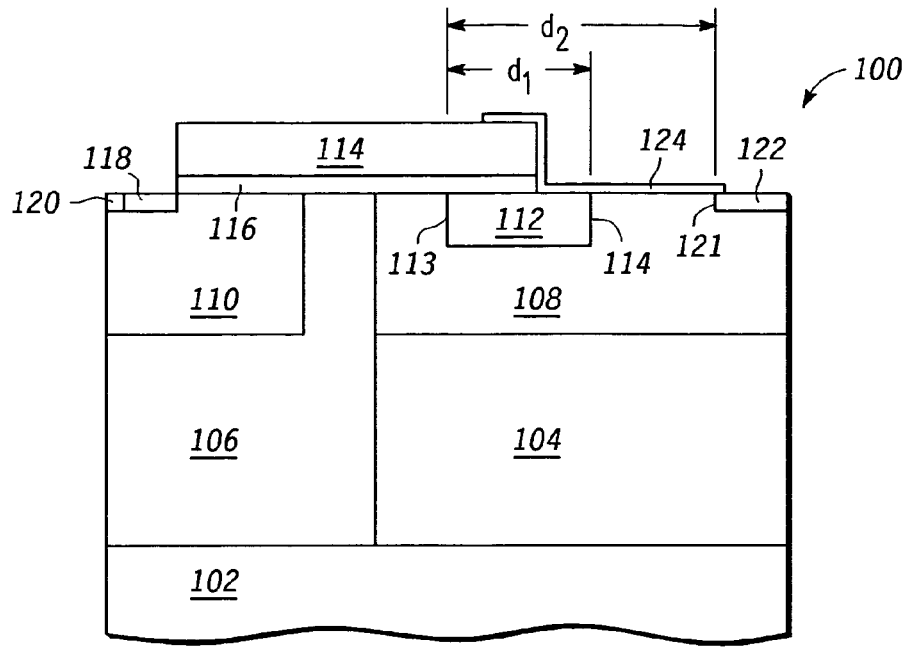
FIG. 1 is a cross-sectional overview of a semiconductor device structure in accordance with one embodiment.

Referring to the cross-sectional overview of FIG. 1, a metal-oxide-semiconductor field effect transistor (MOSFET) device 100 in accordance with one embodiment of the present invention generally includes a drain diffusion (or simply "drain") 122, a source diffusion (or simply "source") 118, and a gate (e.g., a polysilicon gate) 114 having an associated gate oxide 116 provided therebetween. In the illustrated embodiment, drain 122 is an N+ drain formed in a high-voltage N region (HVN) 108, and source 118 is an N+ drain formed in a high-voltage P region (PHV) 110. A P+ region 120 is formed adjacent N+ source 118. PHV region 110 is formed within an epitaxial P layer (P-epi) 106, and HVN region 108 is formed on P-region 104. In the illustrated embodiment, an N buried layer (NBL) 102 is provided below P-epi 106 and P region 104. The N-buried layer 102 in the illustrated embodiment serves as an optional independent terminal. That is, when a suitable conductor is formed from NBL 102 to drain 122, the device exhibits double reduced-surface-field (RESURF) characteristics.

A shallow trench insulator (STI) 112 is formed partially beneath gate 114 such that it extends at least a portion of the distance to drain 122. STI 112 thus helps to minimize gate stress. A silicide block 124 (e.g., an oxide or other dielectric) is provided on the surface of HVN 108 to prevent the formation of a conductive silicide.

The drift region of MOSFET 100 then generally extends from edge 113 of STI 112 to edge 121 of drain 122 (denoted as a distance $d_2$). As shown, STI 112 extends a portion of the distance from edge 113 of STI 112 to edge 119 of STI 112 (denoted as a distance $d_1$). Thus, HVN region 108 exhibits a "step" geometry between edges 113 and 121.

During biased operation, the field in the vicinity of gate 114 and between gate 114 and drain 122 gradually increases. The stepped drift geometry described above helps to reduce the electrostatic potential in the drift region by providing the benefits of both active drift and field drift solutions, allowing an optimized trade-off between breakdown voltage and on-resistance per unit area.

Note that while FIG. 1 (and the subsequent figures) depict an exemplary cross-section, and that certain terms such as width, depth, height, and the like are used herein, these figures are not intended to limit the present invention to linear or rectilinear geometries.

STI 112 includes any suitable combination of dielectric materials, including, for example, various oxides, nitrides, oxy-nitrides, and the like. The depth, width ($d_1$), and overall placement of STI 112 may be selected in accordance with known design principles, and may be determined using a variety of target parameters, such as target breakdown voltage, desired on-resistance, current-handling capability, safe operating area (SOA) considerations, and the like. In one embodiment, for example, STI has a width that is approximately 50% to 75% of the drift region (i.e., $0.5 > d_1/d_2 > 0.75$). In one embodiment, for example, the depth of STI 112 is approximately 0.35 microns, and the width of STI 112 preferably about 0.5 to 5.0 microns. The fabrication of STI regions is well known in the art, and thus need not be discussed in detail herein.

Silicide block 124 (which typically includes an oxide, nitride, or other such dielectric) is used in applications that employ silicide as a conductor (e.g., a conductive contact to gate 114). But for the presence of silicide block 124 over the otherwise exposed areas of HVN region 108, a layer of conductive silicide would form on the surface of HVN 108 at the same time the silicide conductors are formed, effectively shorting out that portion of the drift region. It will be appreciated, however, that the stepped drift region of the present invention may be employed in devices that do not employ silicide conductors and traces.

Figure 2:
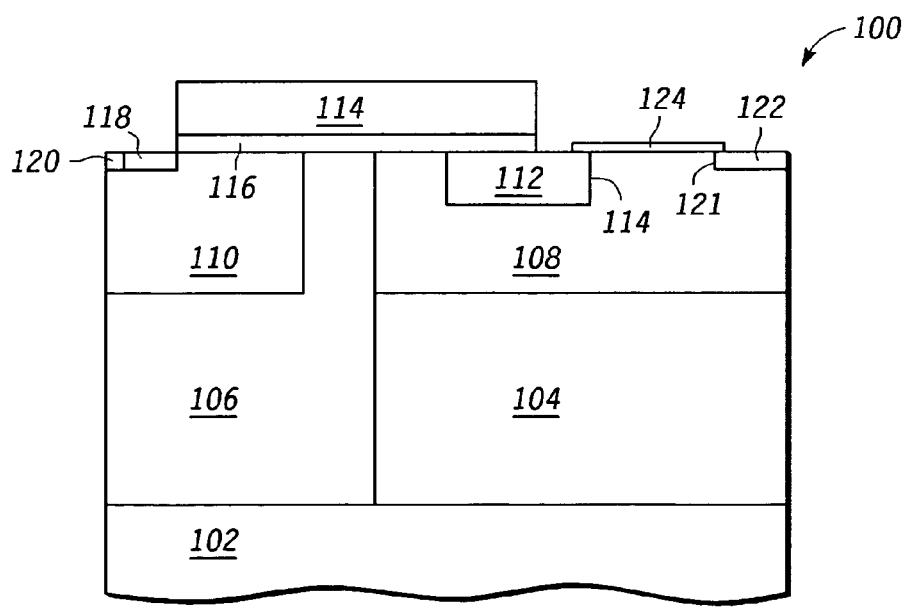
FIG. 2 is a cross-sectional overview of a semiconductor device in accordance with an alternate embodiment.

In the illustrated embodiment shown in FIG. 1, silicide block 124 extends to and overlaps the side and part of the topside of gate 114. It will be appreciated, however, that the invention is not so limited, and that silicide block 124 may have a variety of shapes and sizes. Referring to FIG. 2, for example, silicide 124 may be formed such that it does not extend entirely to gate 114, and merely covers the otherwise exposed surface of HVN region 108.

While FIG. 1 depicts a specific laterally-diffused MOSFET configuration useful in explaining the present invention, it will be appreciated that the stepped drift region described herein may be applied to any suitable MOSFET structure now known or later developed.

Figure 3:
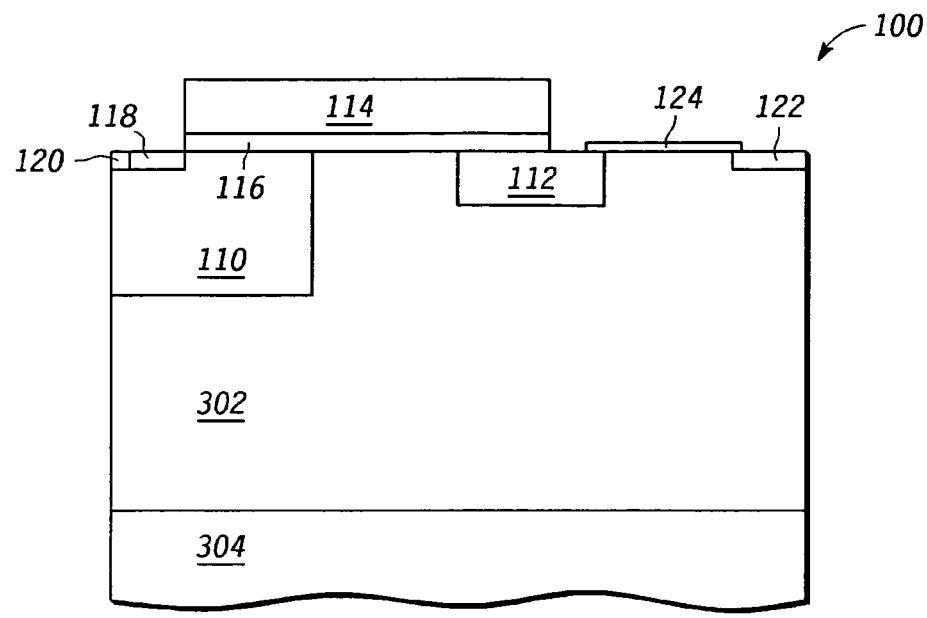
FIG. 3 is a cross-sectional overview of a semiconductor device in accordance with another embodiment.

As shown in FIG. 3, for example, an N+ source 118 and adjacent P+ region 120 are formed in PHV region 110, while N+ drain 122 is formed in an extended N region ($N_{ext}$) 302 which itself is formed on P substrate 304. STI region 112, which is partially overlapped by gate 114, extends a portion of the way to N+ drain 122, and the surface of $N_{ext}$ 302 between STI 112 and drain 122 is suitably protected by a silicide block 124. As described above in connection with FIG. 1, however, silicide block 124 may extend to and overlap a portion of the topside of gate 114.

Figure 4:
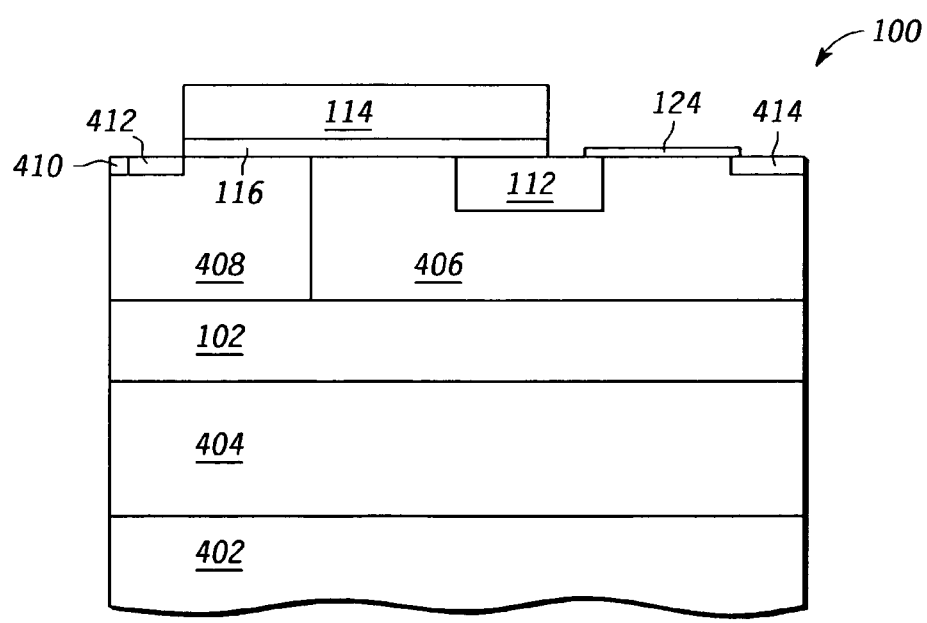
FIG. 4 is a cross-sectional overview of a semiconductor device in accordance with another embodiment.

In yet another embodiment, shown in FIG. 4, the conductivity-types of the respective regions are reversed. More particularly, a P+ source region 412 and adjacent N+ region 410 are provided in a NHV region 408, while P+ drain 414 is formed within HVP region 406. NVH 408 and HVP 406 are formed on a stack comprising NBL 102, a P– epitaxial layer 404, and a P substrate 402. As discussed in connection with the previous embodiments, an STI region 112 if formed within HVP 406 such that it is partially overlapped by gate 114 and extends a portion of the distance to P+ drain 414. A silicide block 124 is formed on the surface of HVP 406 between and partially overlapping STI 112 and P+ drain 414.

The structures shown in FIGS. 1-4 may be fabricated in a number of ways using conventional semiconductor processing techniques known in the art. Furthermore, the order in which the various layers and structures are fabricated may vary depending upon process flow considerations. Generally, the silicide block layer 124 will be deposited after formation of STI 112 and before formation of any silicide conductors. STI 112 is formed prior to formation of gate 114 (to allow overlap as described above). The formation of NBL 102, P-epi 106, P region 104, HVN 108, PHV 110, and the other structures shown in FIGS. 1-4 are known in the art, and need not be described herein. Furthermore, it will be understood that the specific dopant levels, dielectric thicknesses, and diffusion depths may be selected to achieve the desired device characteristics.

In summary, what has been described is a metal-oxide semiconductor field effect transistor (MOSFET) comprising a drain region having a first conductivity type; a source region having the first conductivity type; a gate provided between the drain region and the source region; and a shallow-trench insulator (STI) region partially overlapped by the gate and extending partially to the drain region.

In one embodiment, the MOSFET further comprises a silicide block layer extending from the STI to the drain region. The silicide block may or may not extend to and contact the gate.

In one embodiment, the STI has a first edge and a second edge, wherein the first edge and the second edge of the STI is separated by a distance $d_1$; the drain region has a first edge, wherein the first edge of the drain region and the first edge of the STI are separated by a distance $d_2$; and and the ratio $d_1/d_2$ is less than about 0.75. In a further embodiment, $d_1/d_2$ is greater than about 0.50.

In another embodiment, the MOSFET includes a buried layer having the first conductivity type, wherein the buried layer is coupled to the drain region.

In another embodiment, the drain region is formed in a semiconductor layer having the first conductivity type and having a dopant concentration that is less than a dopant concentration of the drain region (i.e., a high-voltage region).

In accordance with one embodiment, a stepped drift structure for use in connection with a MOSFET device having a drain diffusion and a gate comprises: a shallow-trench insulator (STI) region partially overlapped by the gate and extending a portion of a distance to the drain diffusion; and a silicide block layer extending from the STI to the drain diffusion. In one embodiment, the STI extends less than approximately 75% of the distance to the drain diffusion. In another, the STI extends greater than approximately 50% of the distance to the drain diffusion. In accordance with one embodiment, the silicide block extends to and contacts the gate.

A method for forming a metal-oxide semiconductor field-effect transistor (MOSFET) in accordance with the present invention generally includes: forming a drain region having a first conductivity type; forming a source region having the first conductivity type; forming a shallow-trench insulator (STI) region between the drain region and the source region, wherein the STI extends partially to the drain region; and forming a gate between the drain region and the source region, wherein the gate partially overlaps the STI.

One embodiment further includes forming a silicide block layer extending from the STI to the drain region. In another, the silicide block extends to and contacts the gate.

In accordance with one embodiment, the STI is formed such that it has a first edge and a second edge separated by a distance $d_1$; and the drain region is formed such that it has a first edge, separated from the first edge of the STI by a distance $d_2$, wherein the ratio $d_1/d_2$ is less than about 0.75. In one embodiment, the ratio $d_1/d_2$ is greater than about 0.50.

In an additional embodiment, the method includes forming a buried layer having the first conductivity type, wherein the buried layer is coupled to the drain region. In another embodiment, the drain region is formed in a semiconductor layer having the first conductivity type and having a dopant concentration that is less than a dopant concentration of the drain region. The first conductivity type may be, for example, N-type or P-type.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A metal-oxide semiconductor field effect transistor (MOSFET) comprising:
   a drain region having a first conductivity type;
   a source region having the first conductivity type;
   a gate provided between the drain region and the source region; and
   a shallow-trench isolation (STI) region partially overlapped by the gate and extending partially to the drain region;
   a silicide block layer extending between and contacting the gate, the STI, and the drain regions.

2. The MOSFET of claim 1, wherein:
   the STI has a first edge and a second edge, wherein the first edge and the second edge of the STI is separated by a distance $d_1$;
   the drain region has a first edge, wherein the first edge of the drain region and the first edge of the STI are separated by a distance $d_2$;
   the ratio $d_1/d_2$ is less than about 0.75.

3. The MOSFET of claim 2, wherein the ratio $d_1/d_2$ is greater than about 0.50.

4. The MOSFET of claim 2, further comprising a buried layer having the first conductivity type, wherein the buried layer is coupled to the drain or source region.

5. The MOSFET of claim 2, wherein the drain region is formed in a semiconductor layer having the first conductivity type and having a dopant concentration that is less than a dopant concentration of the drain region.

6. A stepped drift structure for use in connection with a MOSFET device having a drain diffusion and a gate, said stepped drift structure comprising:
   a shallow-trench isolation (STI) region partially overlapped by the gate and extending a portion of a distance to the drain diffusion;
   a silicide block layer extending between and contacting the gate, the STI, and the drain diffusion.

7. The stepped drift structure of claim 6, wherein the STI extends less than approximately 75% of the distance to the drain diffusion.

8. The stepped drift structure of claim 7, wherein the STI extends greater than approximately 50% of the distance to the drain diffusion.

9. The stepped drift structure of claim 7, wherein the silicide block extends to and contacts the gate.

10. A method for forming a metal-oxide semiconductor field-effect transistor (MOSFET) comprising:
    forming a drain region having a first conductivity type;
    forming a source region having the first conductivity type;
    forming a shallow-trench isolation (STI) region between the drain region and the source region, wherein the STI extends partially to the drain region;
    forming a gate between the drain region and the source region, wherein the gate partially overlaps the STI; and
    forming a silicide block layer extending between and contacting the gate, the STI, and the drain regions.

11. The method of claim 10, wherein:
    the STI is formed such that it has a first edge and a second edge separated by a distance $d_1$;
    the drain region is formed such that it has a first edge, separated from the first edge of the STI by a distance $d_2$, wherein the ratio $d_1/d_2$ is less than about 0.75.

12. The method of claim 11, wherein the ratio $d_1/d_2$ is greater than about 0.50.

13. The method of claim 10, further comprising forming a buried layer having the first conductivity type, wherein the buried layer is coupled to the drain region.

14. The method of claim 10, wherein the drain region is formed in a semiconductor layer having the first conductivity type and having a dopant concentration that is less than a dopant concentration of the drain region.

15. The method of claim 10, wherein the first conductivity type is N-type.

16. The method of claim 10, wherein the first conductivity type is P-type.

* * * * *